US012490371B2

United States Patent
Hsu et al.

(10) Patent No.: US 12,490,371 B2
(45) Date of Patent: Dec. 2, 2025

(54) COMPONENT CARRIER WITH EMBEDDED COMPONENT ON STEPPED METAL STRUCTURE WITH CONTINUOUSLY FLAT BOTTOM SURFACE IN AT LEAST ONE HORIZONTAL DIMENSION

(71) Applicant: AT&S (Chongqing) Company Limited, Chongqing (CN)

(72) Inventors: Steve Hsu, Chongqing (CN); Hans Park, Chongqing (CN)

(*) Notice: Subject to any disclaimer, the term of this patent is extended or adjusted under 35 U.S.C. 154(b) by 256 days.

(21) Appl. No.: 17/936,692

(22) Filed: Sep. 29, 2022

(65) Prior Publication Data
US 2023/0098587 A1    Mar. 30, 2023

(30) Foreign Application Priority Data

Sep. 29, 2021 (CN) .......................... 202111150053.8

(51) Int. Cl.
*H05K 1/02* (2006.01)
*H05K 3/00* (2006.01)
(Continued)

(52) U.S. Cl.
CPC ......... *H05K 1/0207* (2013.01); *H05K 3/0032* (2013.01); *H05K 3/3436* (2013.01); *H05K 3/383* (2013.01); *H05K 3/384* (2013.01); *H01L 23/13* (2013.01); *H01L 23/49844* (2013.01); *H01L 24/16* (2013.01); *H01L 24/32* (2013.01); *H01L 24/73* (2013.01); *H01L 2224/16235* (2013.01); *H01L 2224/32225* (2013.01); *H01L 2224/32245* (2013.01); *H01L 2224/73204* (2013.01); *H01L 2924/1511* (2013.01); *H01L 2924/15153* (2013.01); *H01L 2924/3511* (2013.01);
(Continued)

(58) Field of Classification Search
CPC .................................................... H05K 1/0207
USPC ................................................. 361/760–767
See application file for complete search history.

(56) References Cited

U.S. PATENT DOCUMENTS

| 6,187,418 B1 | 2/2001 | Fasano et al. |
| 2005/0151241 A1 | 7/2005 | Reddy et al. |

(Continued)

FOREIGN PATENT DOCUMENTS

| CN | 110708861 A | 1/2020 |
| CN | 211152322 U | 7/2020 |

(Continued)

OTHER PUBLICATIONS

Degroote, B.; Partial European Search Report in Application No. EP 22198479.2; pp. 1-12; Feb. 10, 2023; European Patent Office; 80298, Munich, Germany.

(Continued)

*Primary Examiner* — Stanley Tso
(74) *Attorney, Agent, or Firm* — Robert A. Blaha; Smith Tempel Blaha LLC

(57) ABSTRACT

A component carrier includes a stack with at least one electrically conductive layer structure, at least one electrically insulating layer structure, a cavity delimited at a bottom side at least partially by a top side of a stepped metal structure of the at least one electrically conductive layer structure, and a component embedded in the cavity and arranged on the stepped metal structure. A bottom side of the stepped metal structure has a flat surface extending continuously along at least one horizontal direction.

19 Claims, 7 Drawing Sheets

(51) Int. Cl.
  *H05K 3/34* (2006.01)
  *H05K 3/38* (2006.01)
  *H01L 23/00* (2006.01)
  *H01L 23/13* (2006.01)
  *H01L 23/498* (2006.01)

(52) U.S. Cl.
  CPC .............. *H01L 2924/35121* (2013.01); *H05K 2201/0373* (2013.01); *H05K 2201/09036* (2013.01); *H05K 2201/09136* (2013.01); *H05K 2201/10166* (2013.01); *H05K 2203/0307* (2013.01)

(56) References Cited

U.S. PATENT DOCUMENTS

| | | |
|---|---|---|
| 2005/0280152 A1 | 12/2005 | Fitzsimmons et al. |
| 2007/0164438 A1 | 7/2007 | Sir et al. |
| 2008/0116588 A1 | 5/2008 | Van Kleef et al. |
| 2011/0155433 A1 | 6/2011 | Funaya et al. |
| 2012/0126399 A1 | 5/2012 | Lin et al. |
| 2012/0281377 A1 | 11/2012 | Kini |
| 2013/0119547 A1 | 5/2013 | Kim et al. |
| 2013/0140689 A1 | 6/2013 | Chen |
| 2016/0005673 A1 | 1/2016 | Standing et al. |
| 2016/0141236 A1 | 5/2016 | Kurita |
| 2017/0047264 A1* | 2/2017 | Im .................. H01L 23/3736 |
| 2018/0233429 A1 | 8/2018 | Yosui et al. |
| 2020/0185332 A1 | 6/2020 | Sugiyama et al. |
| 2020/0303271 A1* | 9/2020 | Wu .................. H01L 23/142 |
| 2022/0022311 A1* | 1/2022 | Chen .................. H01L 21/4882 |

FOREIGN PATENT DOCUMENTS

| | | |
|---|---|---|
| JP | H1140946 A | 2/1999 |
| JP | 2006210713 A | 8/2006 |

OTHER PUBLICATIONS

Office Action in Application No. 202111150053.8; pp. 1-8; Sep. 20, 2025; China National Intellectual Property Administration; No. 6, Xitucheng Lu, Jimenqiao Haidian District, Beijing City, Beijing City, 100088, P.R. China.

English translation of Office Action in Application No. 202111150053.8; pp. 1-8; Sep. 20, 2025; China National Intellectual Property Administration; No. 6, Xitucheng Lu, Jimenqiao Haidian District, Beijing City, 100088, P.R. China.

* cited by examiner

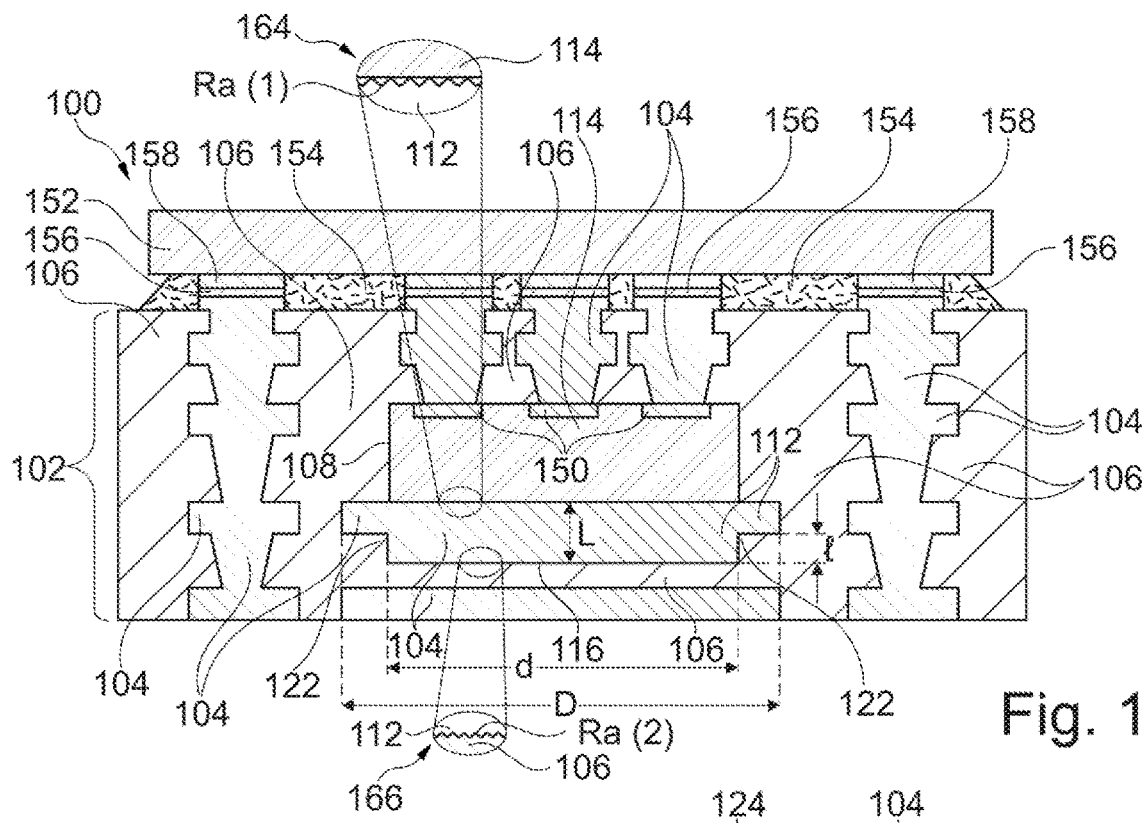
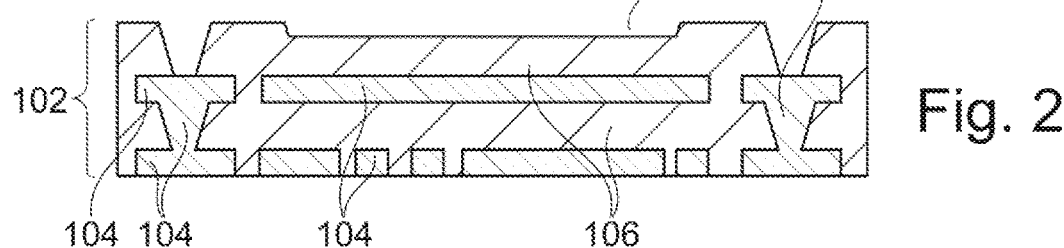
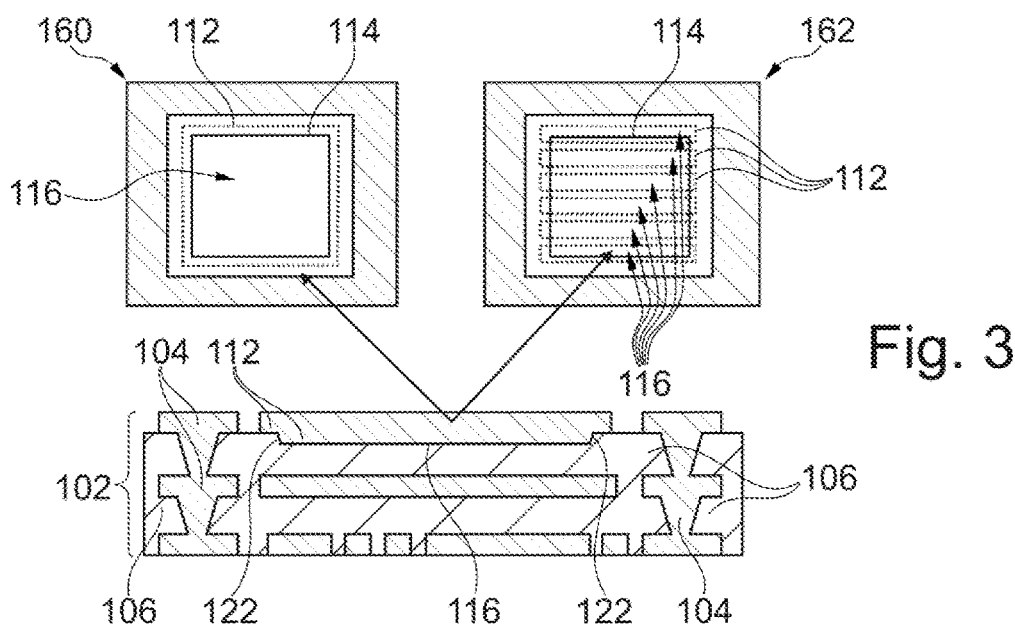
Fig. 1
Fig. 2
Fig. 3

COMPONENT CARRIER WITH EMBEDDED COMPONENT ON STEPPED METAL STRUCTURE WITH CONTINUOUSLY FLAT BOTTOM SURFACE IN AT LEAST ONE HORIZONTAL DIMENSION

CROSS-REFERENCE TO RELATED APPLICATIONS

This application claims the benefit of the filing date of Chinese Patent Application No. 202111150053.8, filed on Sep. 29, 2021, the disclosure of which is hereby incorporated herein by reference.

TECHNICAL FIELD

Embodiments of the present invention relate to a method of manufacturing a component carrier and a component carrier.

BACKGROUND ART

In the context of growing product functionalities of component carriers equipped with one or more electronic components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

However, efficiently embedding and connecting components to a component carrier is still an issue. Component carriers with embedded components suffer frequently from issues such as delamination and/or warpage.

SUMMARY

There may be a need for a reliable component carrier with low tendency of delamination and/or warpage.

According to an exemplary embodiment of the invention, a component carrier is provided which comprises at least one electrically conductive layer structure, at least one electrically insulating layer structure and a cavity delimited at a bottom side at least partially by a top side of a stepped metal structure of the at least one electrically conductive layer structure, and a component embedded in the cavity and arranged on the stepped metal structure, wherein a bottom side of the stepped metal structure has a flat surface extending continuously along at least one horizontal direction.

According to another exemplary embodiment of the invention, a method of manufacturing a component carrier is provided, wherein the method comprises providing a stack comprising at least one electrically conductive layer structure and at least one electrically insulating layer structure, forming a cavity in the stack being delimited at a bottom side at least partially by a top side of a stepped metal structure of the at least one electrically conductive layer structure, wherein a bottom side of the stepped metal structure is formed with a flat surface extending continuously along at least one horizontal direction, arranging a component on the stepped metal structure, and embedding the component in the cavity.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "component" may particularly denote an inlay, for instance fulfilling an electronic and/or a thermal task. For instance, the component may be an electronic component. Such an electronic component may be an active component such as a semiconductor chip comprising a semiconductor material, in particular as a primary or basic material. The semiconductor material may for instance be a type IV semiconductor such as silicon or germanium or may be a type III-V semiconductor material such as gallium arsenide. In particular, the semiconductor component may be a semiconductor chip such as a naked die or a molded die.

In the context of the present application, the term "cavity" may particularly denote a hole in the component carrier, in particular a blind hole or a (for instance stepped) through hole. A cavity may be delimited at least partially by a bottom portion of the component carrier and/or may be delimited at least partially by one or more sidewalls of the component carrier, in particular fully circumferentially. It is also possible that the cavity delimited by the component carrier has an at least partially open bottom and/or an at least partially open side.

In the context of the present application, the term "stepped metal structure" may particularly denote an integral metal body having a side surface with a cornered or rounded discontinuity resulting in a varying lateral end position in a vertical direction. A corresponding step may be formed at one sidewall of the metal structure, at two opposing sidewalls of the metal structure or along the entire lateral outline of the metal structure. In particular, a diameter of the stepped metal structure may vary in a vertical direction, in particular in a discontinuous way. The metal structure may be provided with one step or with a plurality of steps at its sidewall. The stepped metal structure may be connected at its top side with the embedded component and may be arranged inside the stack. The stepped metal structure may have a thickness profile along its sidewalls.

In the context of the present application, the term "bottom side having a flat surface extending continuously along at least one horizontal direction" may particularly denote that the bottom-sided surface of the stepped metal structure may comprise at least a surface portion being flat or planar along an entire extension of the bottom surface in at least one horizontal direction. The entire extension may refer to an entire end-to-end-distance between two opposing edges of the bottom-sided surface of the metal structure. For instance, the flatness of at least a portion of the bottom-sided surface of the stepped metal structure over its entire width may be present in only one direction within the horizontal plane (for instance in the form of one or more oblong rills or strips), or over two (in particular mutually orthogonal) or more directions within the horizontal plane. The bottom-sided surface of the stepped metal structure may refer to the lowermost end surface within a horizontal plane up to which the stepped metal structure extends at its bottom side. FIG. 23 shows various examples for bottom sided profiles of a stepped metal structure having a flat bottom surface extending continuously along at least one horizontal direction. A metal structure with only partially flat or planar bottom surface may thus have a thickness profile at said bottom surface.

According to an exemplary embodiment of the invention, a component carrier is provided which has a (preferably laminated) layer stack with an embedded component (preferably a semiconductor chip) which is protected against undesired delamination and warpage. In particular, this may be achieved by mounting the embedded component on a laterally stepped metal structure in the stack, the stepped metal structure having a bottom-sided surface being at least partially flat along one or more horizontal directions. Advantageously, one or more lateral steps of the metal structure may mechanically anchor the metal structure, and indirectly the embedded component mounted thereon, within the layer stack. Furthermore, the at least partially flat bottom-sided surface of the stepped metal structure may displace a significant amount of dielectric resin of the layer stack below the component. This may shield the component from thermal stress when thermally curing the resin, for instance in terms of lamination. During curing, resin may experience curing shrinkage which make create a considerable amount of stress resulting conventionally in a pronounced tendency of delamination and warpage of an embedded component. By a bottom side of the stepped metal structure having a flat surface extending continuously along at least one horizontal direction, it can be ensured that a sufficient amount of metallic material is located directly beneath the embedded component in a continuous way at least along one horizontal direction, thereby shielding the embedded component from curing shrinkage-related stress. Moreover, the coefficients of thermal expansion (CTE) of dielectric resin on the one hand and (for instance semiconductor, such as silicon) material of the embedded component on the other hand may be significantly different, which may additionally result conventionally in thermal stress, and consequently delamination and warpage around an embedded component. By the configuration of the stepped metal structure with at least one-dimensionally flat bottom surface, resin in a direct bottom-sided neighborhood of the embedded components may be substituted to a pronounced degree by metal, which may reduce the CTE mismatch around the embedded (in particular semiconductor) component. Thus, the tendency of delamination and warpage may be further suppressed by the improved adaptation of the CTE values within the component carrier. Beyond this, the presence of thermally highly conductive metal (in particular copper) in the form of the stepped metal structure with at least one dimensionally flat bottom surface may provide a bulky thermally highly conductive body thermally coupled with the embedded component, so that the stepped metal structure may contribute significantly to heat dissipation away from the embedded component and/or to heat distribution over a spatially enlarged portion of the component carrier. This may efficiently remove heat created by the embedded (in particular semiconductor) component during operation of the component carrier. As a consequence, the thermal reliability of the component carrier may be improved while simultaneously suppressing hotspots around the embedded component, which might be the origin of additional thermal stress. Concluding, mounting the embedded component on the stepped metal structure with at least one dimensionally flat bottom surface may suppress or even eliminate warpage and/or delamination, and may result in a high mechanical integrity and thermal reliability of the obtained component carrier.

In contrast to conventional approaches, exemplary embodiments of the invention increase the volume of a stepped metal structure below an embedded component for suppressing resin shrinkage-based compressive stress, thermal damage by laser processing, and warpage caused by a CTE mismatch. The described configuration of the stepped metal structure with at least one-dimensionally flat bottom surface may create a large metal volume and a large connection area for suppressing peel-off effects, thereby efficiently reducing the tendency of layer separation or bending of the component carrier.

In the following, further exemplary embodiments of the method and the component carrier will be explained.

In an embodiment, a top side of the stepped metal structure has a recess in and/or around a surface portion on which the component is arranged. Correspondingly, the method may comprise forming a recess on a top side of the stepped metal structure, in particular by surface treatment, such as an adhesion promoting process. Advantageously, a recess at a top surface of the stepped metal structure may level out mechanical stress by providing a mechanical anchoring effect and may also provide for a better resin filling and adhesion to the resin. Such a recess at the top surface of the stacked metal structure in the region in which the component is to be mounted on the stepped metal structure can be formed for example by carrying out surface treatment. By such a surface treatment, the upper metal (in particular copper) surface of the metal structure may be roughened to later improve adhesion between metal structure and component. Advantageously, such surface treatment (which may involve a chemical process such as etching) may form a slight indentation in the upper main surface of the metal structure which contributes to define a mounting position of the component to be embedded. At the same time, the recess with the preferably locally roughened surface may promote adhesion between component and metal structure. Consequently, a proper anchoring of component and metal structure in the layer stack may be achieved, which reduces delamination and warpage tendencies.

In an embodiment, the recess is deeper around the component compared to the surface portion on which the component is arranged. By providing one or more additional recess portions, preferably with locally increased roughness, at the upper main surface of the stepped metal structure laterally with respect to the embedded component, the mechanical anchoring between the stepped metal structure and surrounding layer stack material may be further improved. Also, this tends to lower the risk of delamination. Formation of one or more additional recess portions may be accomplished by carrying out a corresponding adhesion promoting process on the upper main surface of the stepped metal structure, for instance for locally increasing roughness by etching. More precisely, the recess being deeper around the component may be created due to a second surface treatment process (such as a further adhesion promoting process or an etching process) performed after placing the component in the cavity. In this manner, the surface of the component may be roughened as well.

In an embodiment, a surface on a top side of the stepped metal structure has a higher roughness (for instance Ra roughness and/or Rz roughness) than a surface on the bottom side of the stepped metal structure. The roughness of a surface may be defined as and may be measured as the centerline average height Ra. Ra is the arithmetic mean value of all distances of the profile from the centerline. The roughness of a surface may however also be defined as and may be measured as average roughness depth Rz. Rz can be determined when a reference length is sampled from a roughness curve in a direction of a mean line and may denote the distance between the top profile peak line and the bottom profile valley line on this sampled portion as measured in the longitudinal direction of the roughness curve (for instance, Rz may be determined by averaging over five individual measuring paths). For instance, the measurement or determination of roughness Ra and Rz may be carried out according to DIN EN ISO 4287:2010. Advantageously, a relatively high or locally increased roughness on the top side of the stepped metal structure may improve adhesion between the embedded component and the stepped metal structure and may thereby function as a further protection mechanism against delamination.

In an embodiment, a surface on a top side of the stepped metal structure has a roughness Ra of at least 0.8 µm, in particular at least 0.9 µm, and may be for instance 1 µm. Furthermore, a surface on the bottom side of the stepped metal structure may have a roughness Ra of not more than 0.7 µm, in particular of not more than 0.6 µm, and may be for example 0.5 µm. When high performance adhesion promoting agents are used, even a roughness of 0.1 µm or less may be sufficient. The mentioned top-to-bottom roughness difference may be the consequence of a selective roughening process carried out only on the top main surface of the stepped metal structure, for instance by etching, to selectively trim the component-related side of the stepped metal structure. Preferably, the surface on the top side of the stepped metal structure has a roughness Ra of less than 1.5 µm. Further advantageously, the bottom side of the stepped metal structure may have a lower roughness than the top side.

In an embodiment, a surface on a top side of the stepped metal structure has a first portion and a second portion, the first portion and the second portion having different values of the roughness Ra. This may be accomplished by carrying out a surface treatment, in particular an adhesion promoting process, twice. Initially, an adhesion promoting process may be done to create the recess. After the component has been placed into the cavity, the second adhesion promoting process may increase the roughness of the bottom of the cavity, which is not covered by the component, and the roughness of the component itself. Consequently, the structural feature as shown in FIG. 22 may be obtained. Thus, the copper next to the component may be deepened (which may lead to a copper undulation next to the component).

In an embodiment, the stepped metal structure comprises or consists of an upper layer section and a lower layer section, the upper layer section having a different, in particular a larger, diameter than the lower layer section so that a step is formed at a, in particular vertical, sidewall of the metal structure at an interface between the upper layer section and the lower layer section. Thus, a lateral stepping profile of the metal structure may be so that an upper layer section (for instance a planar layer section) of the metal structure has a larger (or smaller) diameter than a lower layer section (for instance a further planar layer section) of the metal structure, so that a step is formed at a vertical sidewall of the metal structure at an interface between the upper layer section and the lower layer section. Such a geometry may result in a proper mechanical anchoring between the stepped metal structure and electrically insulating material (in particular resin such as epoxy resin, optionally comprising reinforcing particles such as glass fibers) of the layers stack. However, the stepped metal structure with the described lateral stepping profile may be integrally formed as one body of homogeneous metallic material. This may improve the mechanical integrity of the stepped metal structure and may thereby strengthen its robustness against stress. For instance, the stepped metal structure may have a substantially T-shaped cross-section.

Rather than being composed of two vertically stacked integral layer sections with different diameters, the stepped metal structure may also be composed of three or more vertically stacked integral layer sections with different diameters. This may also result in a stacked profile at the sidewall of the stepped metal profile and therefore an improved mechanical anchorage.

In an embodiment, the stepped metal structure has a thickness profile in a vertical direction. More specifically, the thickness of the metal structure may be different at different horizontal positions of the stepped metal structure. For instance, the stepped metal structure may have a larger thickness in a central portion thereof as compared to a laterally exterior portion thereof where the thickness may be locally smaller. In addition to at least one vertical step at its sidewall, the stepped metal structure may comprise an additional horizontal step.

In an embodiment, the stepped metal structure has a larger diameter on a top side compared to the bottom side. Such a geometry may ensure a high contact surface between the stepped metal structure and the embedded component. At the same time, the described geometry results in a proper thermal coupling between component and stepped metal structure, which may promote heat removal during operation of the component carrier where the embedded component(s) may be the main heat source(s).

In an embodiment, the stepped metal structure has a step along its entire circumference. Hence, the sidewall of the metal structure may comprise one or more steps along the entire perimeter thereof. This may strengthen the mechanical anchoring between stepped metal structure and stack material and may avoid weak points of the connection between metal structure and stack.

In an embodiment, the stepped metal structure has a thickness in a range from 15 µm to 50 µm, in particular in a range from 20 µm to 30 µm. On the one hand, such thickness values allow the formation of the stepped metal structure with a single plating stage, which may ensure a homogeneous material distribution within the stepped metal structure without mechanically weak interfaces. On the other hand, such a thickness range allows to provide a sufficient amount of metallic material for ensuring a high mechanical strength and a proper capacity of dissipating heat created by the connected embedded component.

In an embodiment, the bottom side of the stepped metal structure comprises one or a plurality of longitudinal and/or transversal oblong strips, in particular mutually spaced by one or a plurality of grooves. Thus, one or more metallic strips or rills may define the bottom surface of the stepped metal structure. Such an embodiment is shown for instance in FIG. 18.

When the bottom side of the stepped metal structure is provided with one or more grooves separating one or more metallic strips from each other which may extend along the entire longitudinal and/or transversal diameter extension of the stepped metal structure at its bottom side, a mechanical anchoring between dielectric stack material and material of the stepped metal structure may also be achieved on the bottom side, not only on the sidewalls. The one or more metallic strips may for instance have a longitudinal or linear extension or may be curved. Such one or more metallic strips may each define a one dimensionally flat surface portion at the bottom side of the stepped metal structure and may prevent an excessive amount of dielectric stack material from getting too close to the bottom side of the embedded component. Again, this suppresses curing shrinkage-based stress and keeps the CTE mismatch in acceptable limits.

In another embodiment, the bottom side of the stepped metal structure is completely planar and defines a two-dimensional flat area. Such an embodiment is shown for instance in FIG. 12. When the bottom side of the stepped metal structure is entirely planar, a high amount of metallic material is located in direct neighborship of the embedded component. This keeps resin of the stack spaced with regard to the embedded component at its bottom side, so that curing shrinkage does not create any noteworthy mechanical stress on the lower side of the component. In addition, this improves the thermal performance of the component carrier and reduces CTE mismatch in the environment of the (for instance semiconductor-type) component.

In an embodiment, the method comprises forming the stepped metal structure by one-stage plating. Correspondingly, the stepped metal structure of the component carrier may be a metallically homogeneous one-stage plating structure. More specifically, such one-stage plating process may include only a single galvanic plating or electroplating stage, rather than multiple separate galvanic plating or electroplating stages. This may ensure that the entire stepped metal structure is made of a homogeneous metallic material without material interfaces or material bridges in between, which may occur by carrying out multiple separate galvanic plating or electroplating stages subsequently. Consequently, the mechanical integrity of the stepped metal structure and thus its robustness for disabling warpage and/or delamination may be improved.

For galvanic deposition or electroplating of the single one-stage plating structure, water-based solutions or electrolytes may be used which contain metal to be deposited as ions (for example as dissolved metal salts). An electric field between a first electrode (in particular an anode) and a preform of the component carrier to be manufactured as second electrode (in particular a cathode) may force (in particular positively charged) metal ions to move to the second electrode (in particular cathode) where they give up their charge and deposit themselves as metallic material on the surface of the preform of the component carrier, to thereby form the one-stage plating structure.

Although the entire one-stage plating structure may be formed by a single galvanic deposition stage, a skilled person will understand that a seed layer of the one-stage plating structure may be formed by another process (for instance by sputtering or electroless deposition). For instance, a very thin metallic seed layer which may function as an electrode of the preform of the component carrier to be coated by galvanic deposition, may be formed by sputtering or electroless deposition.

In an embodiment, the method comprises forming a trench in the stack, and subsequently filling the trench and a laterally larger region above the trench with a metal. In particular, filling the trench with metallic material may be accomplished by carrying out a one-stage electroplating process. By forming a laterally confined trench in a surface portion of the stack prior to forming the stepped metal structure, the stepped profile of the subsequently created metal structure may be precisely defined. The trench and a portion above the trench may be subsequently filled with metallic material, for instance by plating. Thereafter, a surface layer of the deposited metallic material may be patterned to thereby define the lateral spatial limits of an upper portion of the stepped metal structure. Advantageously, patterning the deposited metallic surface layer may not only create the stepped metal structure, but may simultaneously create one or more separate metallic surface portions for electrically connecting buried electrically conductive layer structures of the stack.

In an embodiment, the method comprises forming the trench by laser processing. Removing dielectric surface material of the layer stack for forming a shallow trench to thereby define spatial limits of the subsequently created stepped metal structure may thus be carried out by treatment with a laser beam. Guiding a laser beam along a predefined trajectory of the surface of the stack may allow to form the trench with high spatial accuracy and in a simple way. For instance, a carbon dioxide laser or an excimer laser may be used for this purpose. Alternatively, the trench may also be formed by etching or by a mechanical ablation process, for example routing or drilling.

In the following, different embedding technologies which may be used according to exemplary embodiments for embedding the component in the stack will be explained:

In one embodiment, the method of manufacturing the component carrier comprises embedding the component in an opening of the stack, wherein the opening is at least temporarily closed at a bottom side by a sticky layer during the embedding. In the context of the present application, the term "sticky layer" may particularly denote a tape, film, foil, sheet or plate having an adhesive surface. In use, the sticky layer may be used to be adhered to a main surface of a stack for closing an opening extending through the stack. A component to be embedded may be adhered to the sticky layer for defining a position of the component in the opening and thus relative to the stack. When the sticky layer is removed from the stack before completing manufacture of the component carrier, the sticky layer may be denoted as a temporary carrier. In other embodiments, the sticky layer may however form part of the readily manufacture component carrier. By adhering the component on the sticky tape during the embedding process, the spatial accuracy of the embedding of the component may be significantly improved. After or before this embedding process, the stepped metal profile may be formed below the component.

In another embodiment, the method comprises mounting the component on at least one of the layer structures, and thereafter covering the component with further ones of the layer structures, wherein at least one of said layer structures is provided with an opening accommodating the component. As a result, the component may be arranged in a cavity. For example, the opening of the respective layer structure may be cut as a through hole into the respective layer structure.

In yet another embodiment, the method comprises embedding a release layer in the stack, thereafter, forming an opening in the stack by removing a piece of the stack which is delimited at a bottom side by the release layer, and thereafter accommodating the component in the opening. For instance, such a release layer may be made of a material showing poorly adhesive properties with respect to surrounding stack material. For instance, an appropriate material for the release layer is polytetrafluoroethylene (PTFE, Teflon®), or a waxy compound. Teflon is a registered mark of The Chemours Company FC LLC of Wilmington, Delaware, U.S.A. The method may comprise forming a circumferential cutting trench in the stack extending up to the release layer to thereby separate a piece from the remainder of the stack. Cutting said trench may be accomplished for example by laser drilling or mechanically drilling.

In yet another embodiment, the method comprises forming an opening in the stack by routing (preferably depth routing), and thereafter accommodating the component on a bottom surface of the routed stack in the opening. Routing is an appropriate and simple mechanism of precisely defining a blind hole-type opening for subsequently accommodating the component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The stack may be a laminated stack, i.e., formed by connecting its layer structures by the application of heat and/or pressure.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photoimageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE), a ceramic, and a metal oxide. Reinforcing structures such as webs, fibers or spheres, for example made of glass (multilayer glass) may be used as well. Although prepreg particularly FR4 are usually preferred for rigid PCBs, other materials in particular epoxy-based build-up film or photoimageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, at least one of the electrically conductive layer structures comprises at least one of the group consisting of copper, aluminum, nickel, silver, gold, palladium, titanium and tungsten. Although copper is usually preferred, other materials or coated versions thereof are possible as well, in particular coated with supra-conductive material such as graphene.

At least one component, which can be surface mounted on and/or embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

BRIEF DESCRIPTION OF THE DRAWINGS

FIG. 1 illustrates a cross-sectional view of a component carrier according to an exemplary embodiment of the invention.

FIG. 2, FIG. 3, FIG. 4 and FIG. 5 illustrate cross-sectional views of structures obtained during manufacturing a component carrier shown in FIG. 5 and being similar to the one shown in FIG. 1 according to an exemplary embodiment of the invention.

DETAILED DESCRIPTION OF ILLUSTRATED EMBODIMENTS

Figure 4:
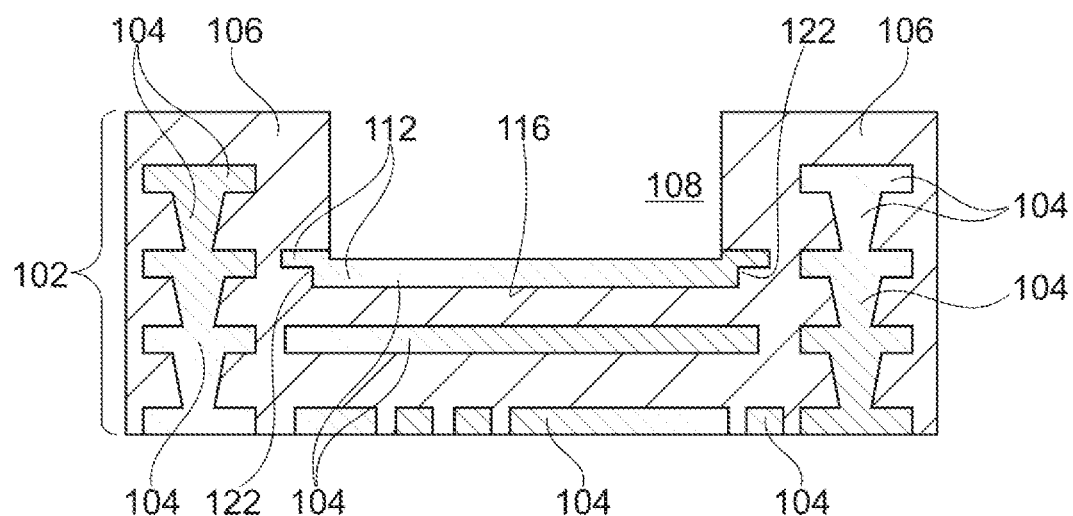

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component carrier with embedded component (preferably embodied as a semiconductor die) is provided which is reliably protected against undesired delamination. More specifically, this may be accomplished by providing a stepped metal structure directly beneath the embedded component on which the embedded component may be directly mounted (preferably at a main surface of the embedded component at which the embedded component has no electrical connections or pads). By embodying a bottom side of the stepped metal structure along its entire extension with a continuous flat surface along at least one horizontal direction, a massive metallic body may displace a significant amount of dielectric resin material from an underside of the component. Hence, mechanical stress exerted to a bottom side of the embedded component due to resin shrinkage when curing resin for instance in terms of lamination may be efficiently suppressed. Moreover, a CTE (coefficient of thermal expansion) mismatch at a bottom side of the embedded component may be prevented which may additionally reduce stress acting on the embedded component. Furthermore, a pronounced amount of metallic material directly beneath the embedded component may contribute to heat removal during operation of the component carrier and may thereby further suppress undesired phenomena such as delamination and/or warpage. For instance, a bottom surface of the stepped metal structure may be continuously flat only along one horizontal direction by providing one or multiple metallic strips or rills extending along the entire diameter of the bottom side. In another embodiment, the bottom surface of the stepped metal structure may be entirely and continuously flat along two mutually orthogonal horizontal directions by being planar over the entire two-dimensional extension of the bottom surface of the stepped metal structure.

After a reflow process for electrically connecting (for instance by soldering) one or more pads of an embedded component (in particular embodied as semiconductor die) to an exterior surface of a stack of a component carrier, the component carrier may suffer from delamination and/or warpage in particular in a region adjacent to the embedded component. Without wishing to be bound to a specific theory, it is presently believed that these undesired phenomena are due to a CTE mismatch between different materials at an interface between the embedded component and a laminated layer stack. Such a CTE mismatch may induce stress during a thermal process. Also curing shrinkage of previously at least partially uncured resin of a laminated layer stack may promote delamination beneath and/or around the component. As a result, die bending may occur during a thermal process forcing also a stack environment of the die to bend. In view of a convention-al weak adhesion between dielectric resin material of the layer stack and the embedded component, delamination may easily occur in conventional approaches. In order to resolve such and/or other issues, a stepped metal structure with one or two-dimensional flat bottom surface may be arranged under the embedded component. As a result, an anchor force may be created increasing the adhesion between embedded component and the laminated layer stack by means of the stepped metal structure with at least one dimensionally flat bottom. In particular, an improved adhesion between dielectric material of the layer stack and one or more pads of the embedded component may be achieved by taking this measure.

Thus, exemplary embodiments of the invention may achieve an improvement in terms of die stage delamination. More specifically, delamination at and/or around an embedded semiconductor-type component carrier may be efficiently suppressed by providing a bottom sided stepped metal structure with continuous extension along one or two horizontal dimensions. This may avoid excessive resin reservoirs within a bottom portion of the stepped metal structure, which may result in turn in reduced thermal and mechanical stress exerted to the embedded component.

Advantageously, taking this measure may significantly reduce any tendencies of die stage pad delamination. Furthermore, this may allow to embed even larger semiconductor-type components in a laminated layer stack of the component carrier such as a printed circuit board (PCB). Moreover, a massive, stepped metal structure with at least one-dimensionally continuous flat bottom surface may introduce a highly thermally conductive body in the layer stack, thereby significantly enhancing heat dissipation away from the semiconductor-type embedded component. When the stepped metal structure is made of copper, a higher thermal performance may be synergistically combined with a reduced CTE mismatch. Since a semiconductor material (in particular silicon) may have a significantly different CTE value compared to material of the layer stack, delamination tendencies of embedded semiconductor components are traditionally high. In particular, a pronounced CTE mismatch may induce stress during thermal processes. By a copper thickness increase effect due to a copper-type stepped metal structure, the CTE distribution within the component carrier may be rendered more homogeneously which may result in a reduction of warpage. By suppressing delamination and warpage, the reliability of the component carrier may be improved by exemplary embodiments of the invention.

Advantageously, it may be possible to electrically isolate the bottom-sided stepped metal structure from electric signal propagation in the component carrier. In particular, a stepped copper structure underneath an embedded electronic component may be designed without signal contact (for instance without electric connection with a pad of the component), thereby improving the electric reliability.

In particular, exemplary embodiments of the invention may add a bottom sided flat dummy pad and/or one or more longitudinal bar vias under die stage area. The stepped configuration of the metal structure and/or a bottom-sided surface profile of the metal structure maintaining flatness in at least one horizontal direction may provide an additional anchor force for keeping a die-type embedded component properly embedded in dielectric material of a laminated layer stack to reliably prevent delamination even in the presence of thermal shocks.

For example, a bottom-sided surface profile with continuous flatness in at least one horizontal direction may be formed advantageously by laser processing, for instance using a carbon dioxide laser. This may increase the thermal and mechanical stability of the obtained component carrier.

FIG. 1 illustrates a cross-sectional view of a component carrier 100 according to an exemplary embodiment of the invention.

The component carrier 100 according to FIG. 1 may be configured as a substantially plate-shaped printed circuit board (PCB). Thus, the component carrier 100 shown in FIG. 1 may be highly compact in a vertical direction. More specifically, the component carrier 100 may comprise a layer stack 102 comprising one or more electrically conductive layer structures 104 and/or one or more electrically insulating layer structures 106. Each of the electrically conductive layer structures 104 may comprise a layer section (for instance a structured copper foil) and vertical through connections, for example copper filled laser vias which may be created by laser drilling and plating. The electrically insulating layer structure(s) 106 may comprise a respective resin (such as a respective epoxy resin), optionally comprising reinforcing particles therein (for instance glass fibers or glass spheres). For instance, the electrically insulating layer structures 106 may be made of FR4.

Moreover, the stack 102 may comprise an internal cavity 108 which is filled, in the shown embodiment, by an embedded semiconductor-type component 114. The cavity 108 is delimited at its bottom side by a top side of a stepped metal structure 112 of the electrically conductive layer structures 104.

The component 114, for instance a naked silicon die with one or more integrated circuit elements (for instance a field effect transistor) is embedded in the cavity 108 and is mounted directly (for instance with direct physical contact) on the stepped metal structure 112. In the shown embodiment, the component 114 has pads 150 only on its upper main surface, whereas the lower main surface of the component 114 is electrically inactive in the shown example. Thus, the embedded component 114 may be mount-ed at its electrically inactive side directly on the stepped metal structure 112 (for instance by gluing or soldering). However, the component 114 (for instance when embodied as die) may be provided with an adhesive film adhered to the component 114. In such a scenario, it may be possible to directly mount the component 114 onto the stepped metal structure 112. Hence, it may be optionally possible to provide an adhesive film in between the stepped metal structure 112 and the main body of the component 114.

During operation of the component carrier 100, the embedded component 114 may be a main heat source, so that the stepped metal structure 112 being made preferably of copper may function for dissipating and removing heat from the embedded component 114. The mentioned pads 150 on the upper main surface of the component 114 are connected by electrically conductive vertical through connections of the electrically conductive layer structures 104, more specifically by a sequence of stacked copper-filled laser vias and patterned copper foils, to an upper main surface of the laminated layer stack 102.

A surface mounted component 152, for instance a further semiconductor chip, is mechanically mounted on an exterior surface of the stack 102 by for example an underfill, such as an adhesive, glue, or resin. In particular, reference sign 154 can denote any underfill material, whereas reference sign 156 shall be electrically conductive. Thus, for reference sign 156, a solder, a sinter or any other electrically conductive paste may be used. Solder balls are also possible. Furthermore, the surface mounted component 152 may be electrically coupled with the embedded component 114 by the vertical through connections of the electrically conductive layer structures 104 and by solder. More precisely, the solder connects electrically conductive layer structures 104 on the upper main surface of the stack 102 with pads 158 on a lower main surface of the surface mounted component 152. Component 114 may be for example an interposer, whereas the additional component 152 may be a die.

In the following, the stepped metal structure 112 will be described in further detail. Advantageously, a bottom side of the stepped metal structure 112 may have a flat surface 116 extending continuously along one or more horizontal directions. Such an at least one-dimensionally continuously flat bottom surface may for example be embodied as shown with reference signs 160, 162 in FIG. 3.

Referring to the alternative according to reference sign 160, the entire bottom surface of the stepped metal structure 112 may be a planar (for example rectangular) area defining the lowermost flat surface portion of the downwardly protruding lower layer section of the stepped metal structure 112. The bottom portion of the stepped metal structure 112 according to reference sign 160 may thus be configured as a pad. Descriptively speaking, the die area corresponds substantially to the pad area underneath. With this configuration, dielectric resin material of stack 102 is kept spatially away from the bottom of the embedded component 114. Consequently, mechanical stress created by curing shrinkage of said resin during lamination or reflow processing of component carrier 100 may be shielded with regard to the embedded component 114. Furthermore, the CTE mismatch between the semiconductor material of the embedded component 114 and material of the stack 102 may be reduced by displacing dielectric resin from the lower side of the component 114 by copper material of the stepped metal structure 112. Also, this may reduce mechanical stress acting on the embedded component 114 and its surroundings stack material. Furthermore, thermal stress may be guided away from the embedded component 114 by the highly thermally conductive material of the metal structure 112. In other words, by thermally coupling the embedded component 114, acting as a significant heat source during operation of the component carrier 100, with the connected stepped metal structure 112, hotspots at and around the embedded component 114 may be avoided. Consequently, thermal and mechanical stress may be suppressed and undesired phenomena such as delamination and warpage may be avoided.

Now referring to the alternative according to reference sign 162, the bottom side of the stepped metal structure 112 is not necessarily entirely planar but may comprise a plurality of metallic strips or rills between longitudinal grooves. Hence, between each pair of adjacent grooves, a downwardly protruding strip of metallic material extends over the entire spatial extension of the bottom main surface of the stepped metal structure 112. The bottom portion of the stepped metal structure 112 according to reference sign 162 may thus be configured as one or more bar vias. Descriptively speaking, the die area covers substantially the bar via area underneath. Thereby, a one-dimensionally continuously flat bottom surface (corresponding to the extension of the metallic strips) is formed in the stepped metal structure in the alternative according to reference sign 162. In a similar way as described above for the alternative according to reference sign 160, the metallic strips according to the alternative with reference sign 162 also displace resin material beneath the embedded component 114 and thereby reduce the impact of curing shrinkage and CTE mismatch on the mechanical integrity around the embedded component 114. Moreover, the alternative according to reference sign 162 has the additional advantage of a mechanical anchorage between material of the electrically insulating layer structures 106 and the bottom side of the metal structure 112. Also, this holds the constituents of the component carrier 100 firmly together and thereby improves the mechanical and thermal reliability of the component carrier 100.

Advantageously, the stepped metal structure 112 may be a metallically homogeneous one-stage plating structure, i.e., an integral metal body formed by a single galvanic plating process and being thereby free of interior material interfaces. The metallically homogeneous configuration of the stepped metal structure 112 further improves the mechanical integrity of the stepped metal structure 112 and thereby contributes additionally to the low-warpage and low-delamination properties of the component carrier 100 as a whole.

Next, the laterally stepped geometry of metal structure 112 and its impact on the mechanical and thermal reliability of the component carrier 100 will be explained. As shown in FIG. 1, the stepped metal structure 112 consists of an upper layer section and a lower layer section, wherein the upper layer section has a larger diameter, D, in horizontal direction com-pared to a smaller diameter, d, of the lower layer section. The extension of the lower layer section may preferably correspond substantially to the extent of the embedded component 114, as shown in FIG. 1 and with reference signs 160 and 162 in FIG. 3. Thus, the stepped metal structure 112 has a larger diameter, D, on its top side compared to a smaller diameter, d, at its bottom side. Preferably, a ratio between the diameter d of the lower layer section and the diameter D of the upper layer section of the stepped metal structure 112 is in a range from 70% to 90%, for instance 80%. As a result, a fully circumferential step 122 is formed at a vertical sidewall of the metal structure 112 at an interface between the upper layer section and the lower layer section. In other words, the stepped metal structure 112 has a lateral step 122 along its entire perimeter. Consequently, the stepped metal structure 112 has a thickness profile in a vertical direction and a circumferentially closed step 122 at its sidewall. Moreover, the stepped metal structure 112 has a larger thickness, L, in its central portion compared to a smaller thickness laterally. In other words, the upper layer section and the lower layer section together have a thickness, L, whereas the lower layer section alone has a smaller thickness, l. For instance, the smaller thickness, l, may be in a range from 1 µm to 15 µm, whereas the larger thickness, L, may be in a range from 20 µm to 30 µm. The laterally stepped configuration of metal structure 112 has the advantage of an additional mechanical anchoring between the metal structure 112 and dielectric stack material. This may additionally suppress undesired warpage and delamination.

Now referring to reference signs 164 and 166 in FIG. 1, a surface on a top side of the stepped metal structure 112 has a higher roughness Ra (denoted as "Ra(1)") compared to a lower roughness Ra (denoted as "Ra(2)") of a surface on the bottom side of the stepped metal structure 112. In other words, the values of the roughness fulfil the condition Ra(1)>Ra(2). In particular, the surface on the top side of the stepped metal structure 112 may have a value Ra(1) of the roughness Ra of at least 0.8 µm, for instance 1 µm, but preferably less than 1.5 µm. In contrast to this, a surface on the bottom side of the stepped metal structure 112 may have a value Ra(2) of the roughness Ra of not more than 0.7 µm, for instance 0.5 µm. The higher roughness on the top side compared with the bottom side of the stepped metal structure 112 may be obtained by carrying out an adhesion promoting roughening process (for instance by etching) selectively or only on the top side. This promotes adhesion between the stepped metal structure 112 and the embedded component 114 and thereby additionally suppresses delamination and warpage.

Advantageously, the embodiment of the invention according to FIG. 1 avoids implementing laser vias, to be able to use the electrically conductive layer structure 104 (and its corresponding electrically conductive layer) for creating high density interconnections, such as signal routing. If laser vias are used, the electrically conductive layer structure 104 cannot comprise copper traces, as this might lead to a short cut. Additionally, such laser vias may be prone to delamination, as this may involve additional interfaces. Stress may concentrate at these interfaces as well. Thus, the overall mechanical stability such a conventional structure may be decreased. Advantageously, exemplary embodiments of the invention do not suffer from such shortcomings.

Figure 5:
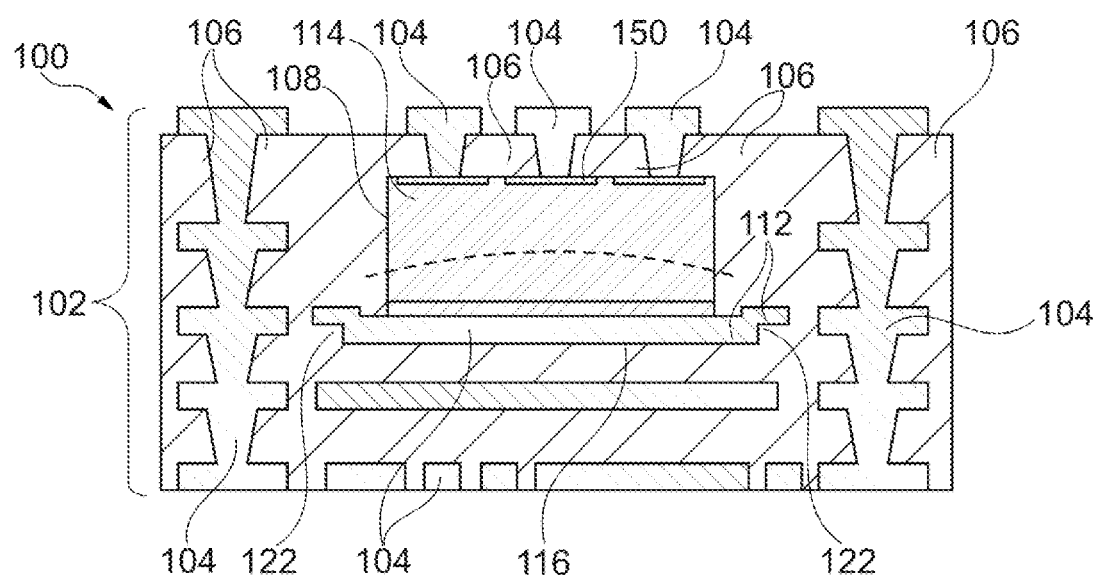

FIG. 2 to FIG. 5 illustrate cross-sectional views of structures obtained during manufacturing a component carrier 100 shown in FIG. 5 and being similar to the one shown in FIG. 1 according to an exemplary embodiment of the invention.

Referring to FIG. 2, a method of manufacturing component carrier 100 according to FIG. 5 comprises forming a shallow trench 124 in a surface portion of a stack 102 by laser processing. By defining shape and dimensions of the trench 124 with a precise laser process, also shape and dimensions of the stepped metal structure 112 may be accurately defined. Highly advantageously, any desired bottom surface profile (for instance planar pad, bar via(s), etc.) of a stepped metal structure 112 to be formed may be precisely designed and defined by the mentioned laser process, compare reference signs 160, 162.

Thereafter and now referring to FIG. 3, the trench 124 and an ad-jacent exposed area of the upper main surface of the stack 102 may be covered with copper by executing a single galvanic plating process (preferably after a previous formation of a seed layer, for instance formed by electro-less deposition). The plated copper layer may then be patterned, for instance by a lithographic etching process. As a result, the stepped metal structure 112 may be obtained as a homogeneous metal structure without interior material bridges. By the patterning, it is simultaneously possible to form electric surface contacts separate from the stepped metal structure 112, as shown in FIG. 3.

In order to obtain the structure shown in FIG. 4, one or more further electrically conductive layer structures 104 and/or one or more further electrically insulating layer structures 106 may be connected to the upper main surface of the structure shown in the cross-sectional view of FIG. 3. For instance, this further build-up may be accomplished by the lamination of further layers, by patterning, laser drilling and/or plating.

Thereafter, a cavity 108 may be formed in the obtained structure. For example, cavity 108 may be formed by routing. Another possibility of forming cavity 108 is the execution of the above-described formation of a release layer made of a material showing poorly adhesive properties with respect to surrounding stack material, followed by a connection of further layer structures and a cut out of a piece of stack material above the release layer.

The cavity 108 may be formed to expose an upper main surface of the stepped metal structure 112. Thereafter, the exposed surface area of the stepped metal structure 112 may be subjected to surface treatment, for instance by locally increasing surface roughness by etching.

In order to obtain the component carrier 100 shown in FIG. 5, the component 114 may then be assembled by inserting it in the cavity 108 and connecting it to the adhesion promoted exposed surface of the stepped metal structure 112. After said die mount process, a further optional adhesion promoting process for promoting adhesion of the remaining exposed surface of the component 114 may be carried out. Thereafter, the build-up may be continued by encapsulation, further lamination, formation of electric contacts, etc.

The embodiments of FIG. 1 to FIG. 5 have the advantage of an improved impact on the embedded die-type component 114 through a copper reinforcement accomplished by stepped metal structure 112. The latter provides an additional anchor force for the embedded component 114. As a consequence, the obtained component carrier 100 may show an advanced performance, wherein in particular delamination around embedded component 114 may be avoided. Furthermore, the heat dissipation property around the embedded component 114 may be enhanced by an increased copper thickness below the component 114. In particular, a warpage improvement may be achieved as well.

Figure 6:
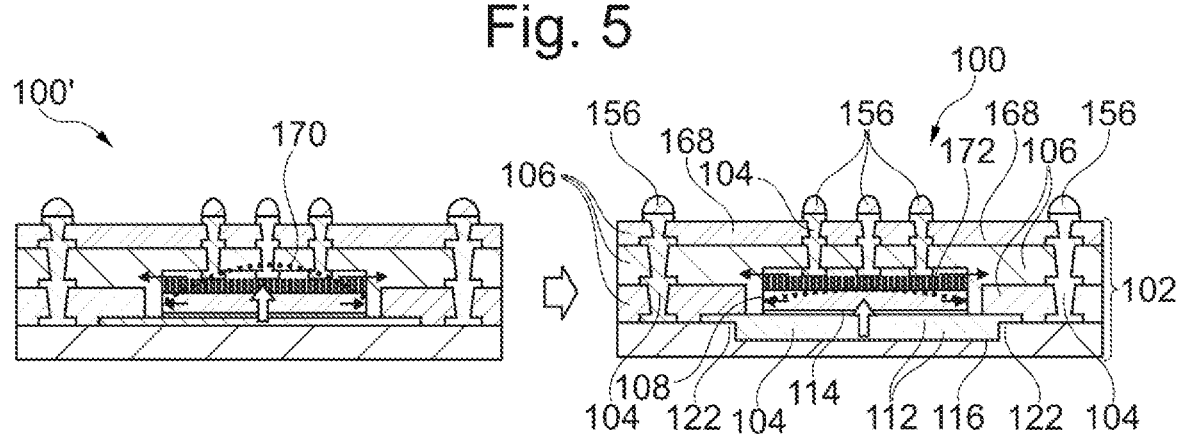
FIG. 6 illustrates a cross-sectional view of a conventional component carrier and of a component carrier according to another exemplary embodiment of the invention.

FIG. 6 illustrates a cross-sectional view of a conventional component carrier 100' and of a component carrier 100 according to another exemplary embodiment of the invention. Apart from the already described features, component carrier 100 has a solder resist 168 on top. As indicated schematically with reference signs 170, 172, delamination forces are significantly stronger in the conventional component carrier 100' compared to component carrier 100 according to an exemplary embodiment of the invention. This is thanks to the above-described design of the stepped metal structure 112. Simulations regarding the stress exerted on the dielectric layer below the metal structure 112 on which the component 114 is assembled were performed. Results show that the stress may decrease by approximately 10% if the copper thickness is increased like it is the case using the stepped metal structure 112.

For instance, the vertical copper thickness of the stepped metal structure 112 may be preferably in a range from 15 μm to 22 μm for improving the delamination behavior. Any tendency of delamination may be further suppressed by carrying out two adhesion promoting processes, as mentioned above. As a result of the reduced risk of delamination and warpage, larger dimensioned components 114 can be embedded compared to conventional approaches.

What concerns the conventional component carrier 100', die bending during thermal processes may also force the die stage to bend, due to the weak adhesion of dielectric material with the die stage. Consequently, there is a high risk of delamination.

Challenging stress in an interior of the component carrier to be manufactured can be caused by different types of phenomena during thermal processes: For example, during curing of resin of stack 102, compressive stress may be created due to curing shrinkage. Furthermore, there is a risk of thermal damage when cavity 108 is formed by laser processing (in particular using a carbon dioxide laser). Furthermore, a reflow process (for instance executed at an elevated temperature of 260° C.) may cause warpage around component 114 due to a CTE mismatch between metallization layer and silicon wafer material. Inhomogeneous thermal expansion in an interior of the component carrier 100 may thus cause additional thermal stress. This creates a risk of die stage delamination due to CTE mismatch induced stress during a thermal process.

In order to overcome at least part of the above-described and/or other shortcomings, the component carrier 100 of FIG. 6 according to an embodiment of the invention implements the stepped metal structure 112 as a mounting base for the component 114. For this design, it may be possible to add one or more laser via bars under the die stage area. By a plating process it may be possible to form a thicker copper body underneath the embedded component 114. The additional pad or via bar(s) provide an anchor force to prevent separation during thermal shocks. Furthermore, heat dissipation away from embedded component 114 may be enhanced due to the high copper thickness of metal structure 112. Beyond this, an improvement of the warpage behavior of the component carrier 100 may be achieved by reducing the CTE mismatch below component 114 which may relax stress during a thermal process.

Figure 10:
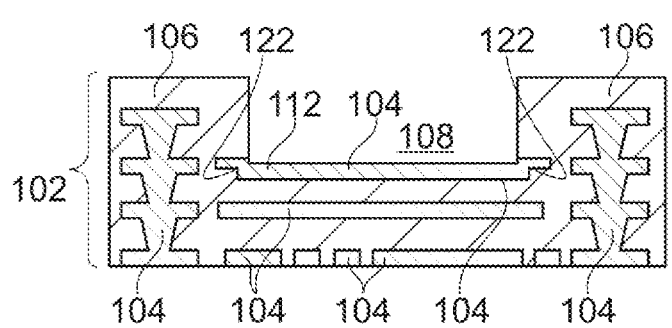
Figure 11:
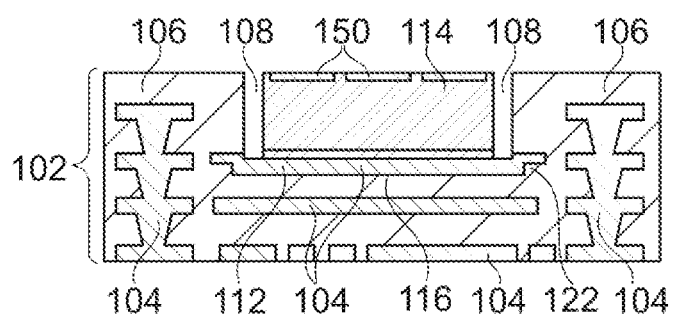
Figure 12:
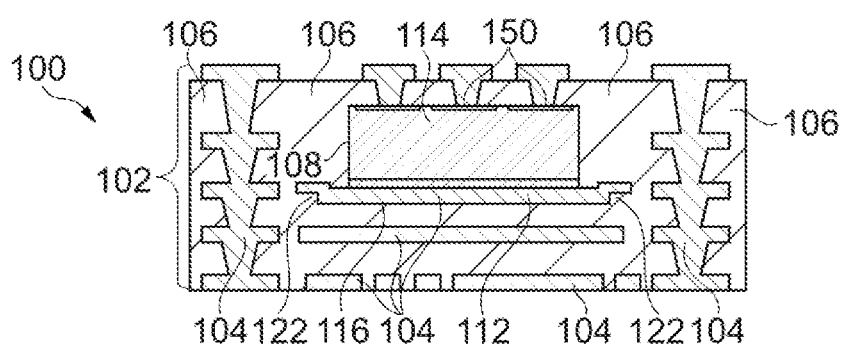
Figure 13:
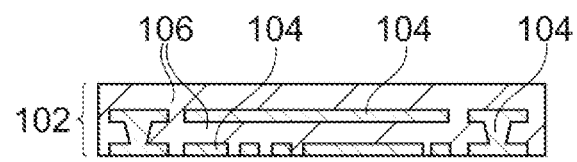
FIG. 13, FIG. 14, FIG. 15, FIG. 16, FIG. 17 to FIG. 18 illustrate cross-sectional views of structures obtained during manufacturing a component carrier, shown in FIG. 18, according to another exemplary embodiment of the invention.

FIG. 7 to FIG. 12 illustrate cross-sectional views of structures obtained during manufacturing a component carrier 100, shown in FIG. 12, according to an exemplary embodiment of the invention.

Figure 7:
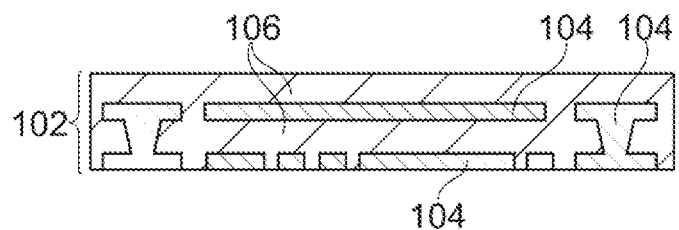
FIG. 7.

Referring to FIG. 7, a laminated layer stack 102 is provided composed of electrically conductive layer structures 104 and electrically insulating layer structures 106.

Figure 8:
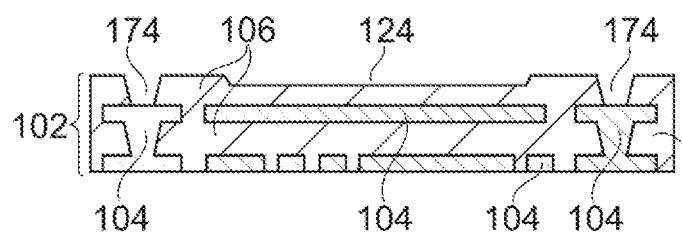
FIG. 8, FIG. 9, FIG. 10, FIG. 11 and FIG. 12 illustrate cross-sectional views of structures obtained during manufacturing a component carrier, shown in FIG. 12, according to an exemplary embodiment of the invention.

Referring to FIG. 8, a trench 124 is formed in a dielectric surface portion of the stack 102 by laser processing. A carbon dioxide laser is a preferred choice for a used laser source. The trench 124 may be formed by guiding a laser beam along a corresponding trajectory. The depth of the trench 124 may be adjusted by the velocity of the laser beam and/or by the laser intensity. Consequently, any desired surface profile may be formed in the trench 124. In the shown embodiment, the trench 124 is formed with constant thickness. Furthermore, laser vias 174 may be simultaneously formed for exposing buried electrically conductive layer structures 104 for electric contact purposes.

Figure 9:
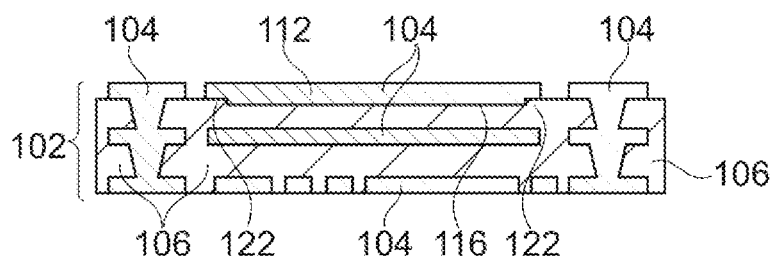

Referring to FIG. 9, the stepped metal structure 112 is formed in and above the trench 124 and in an annular surface area of stack 102 surrounding the trench 124 by one-stage electroplating or one-time electroplating. Preferably, a vertical copper plating process is executed, i.e., a plating process during which a panel (comprising multiple preforms of component carriers 100 to be manufactured) is oriented vertically. Thus, only a single galvanic plating stage is carried out for forming the stepped metal structure 112. Hence, the trench 124 and a laterally larger region above the trench 124 are covered with a metal such as copper for creating the stepped metal structure 112. Descriptively speaking, the stepped metal structure 112 provides for a metallic thickness increase underneath the component 114 to be embedded. In the shown embodiment, a bottom side of the stepped metal structure 112 has a continuously flat surface 116 in the entire horizontal plane. For removing excessive copper which laterally surrounds the stepped metal structure 112, a lithography and etching process may be executed. The latter process may be carried out so that, simultaneously with the lateral definition of the stepped metal structure 112, also one or more electric contacts may be formed on the surface of the stack 102 for contacting lower located electrically conductive layer structures 104 in the stack 102.

Referring to FIG. 10, a further build-up may be executed, and a cavity 108 may then be formed in the stack 102. Said cavity 108 is delimited at a bottom side completely by a top side of the stepped metal structure 112.

In order to promote adhesion between the stepped metal structure 112 and a subsequently assembled component 114, the exposed metallic surface of the stepped metal structure 112 may be subjected to adhesion promotion, for instance by selected surface roughening by etching or by applying an adhesion promoting layer.

Referring to FIG. 11, the component 114 to be embedded is then inserted in the cavity 108 and placed preferably directly on the stepped metal structure 112. Thereafter, a further adhesion promotion process may be carried out.

Referring to FIG. 12, the component 114 is then embedded or encapsulated in the cavity 108, for instance by glue inserted into gaps between component 114 and stack 102 and/or by lamination of further layer structures 104, 106 on top of the structure shown in FIG. 11.

Figure 18:
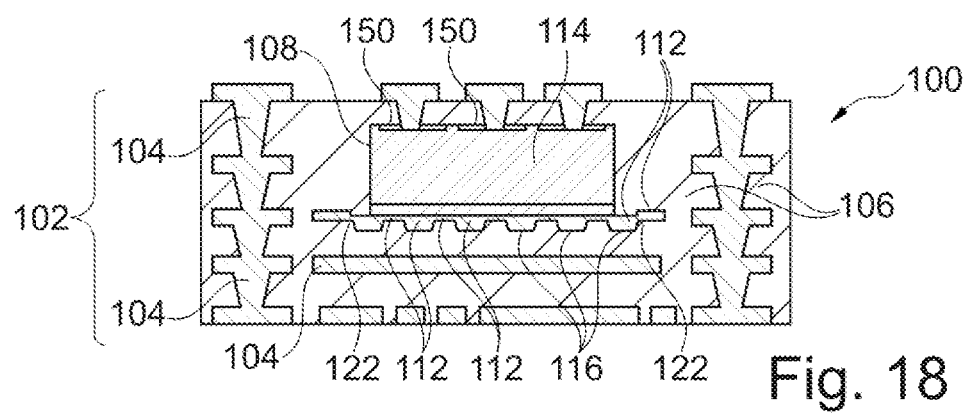

FIG. 13 to FIG. 18 illustrate cross-sectional views of structures obtained during manufacturing a component carrier 100, shown in FIG. 18, according to another exemplary embodiment of the invention.

Figure 14:
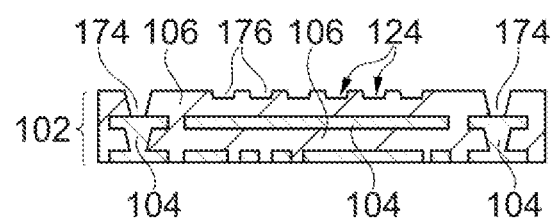
Figure 15:
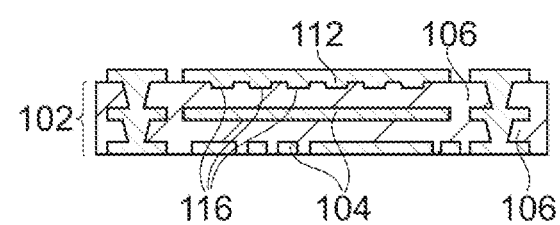
Figure 16:
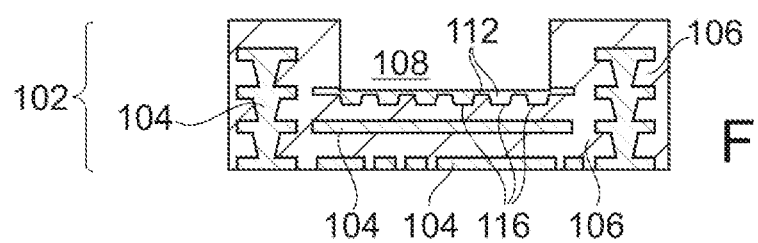
Figure 17:
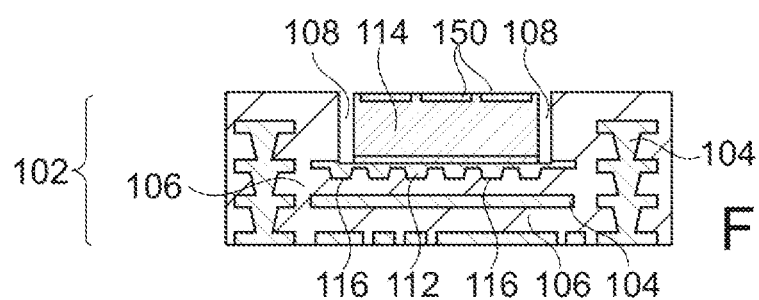

A main difference of the embodiment of FIG. 13 to FIG. 18 compared to the embodiment of FIG. 7 to FIG. 12 is that, in the embodiment according to FIG. 13 to FIG. 18, another surface profile in the bottom of the trench 124 is created according to FIG. 14 (compared with the entirely planar bottom surface of the trench 124 according to FIG. 8). Thus, the trench 124 may be formed with an entirely planar bottom surface (as in FIG. 8) or with a surface profile at a bottom surface (as in FIG. 14).

The laser process carried out for creating trench 124 according to FIG. 14 forms a plurality of oblong parallel grooves 176 extending longitudinally perpendicular to the paper plane of FIG. 14. After plating metallic material (such as copper) in, above and around the trench 124 in a one-stage electroplating process according to FIG. 15, the metal filled grooves 176 constitute metallic strips extending along the entire diameter of the bottom of the stepped metal structure 112 (for instance in a way as shown with reference sign 162 in FIG. 3). Thus, a bottom side of the stepped metal structure 112 shown in FIG. 15 to FIG. 18 has a continuously flat surface 116 over its entire extension in a horizontal direction oriented perpendicular to the paper plane of FIG. 15 to FIG. 18.

Figure 19:
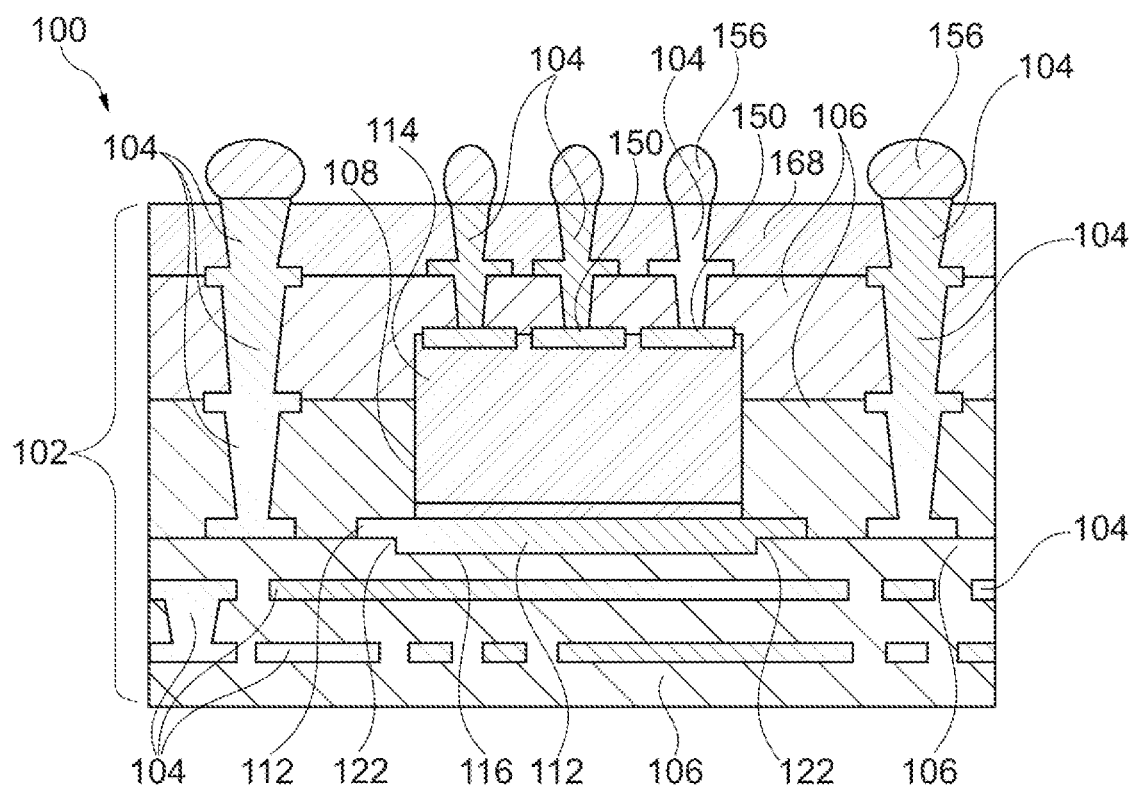
FIG. 19 illustrates a cross-sectional view of a component carrier according to still another exemplary embodiment of the invention.

FIG. 19 illustrates a cross-sectional view of a component carrier 100 according to still another exemplary embodiment of the invention. For instance, an adhesion promoting layer may be arranged between the stepped metal structure 112 and the component 114.

Figure 20:
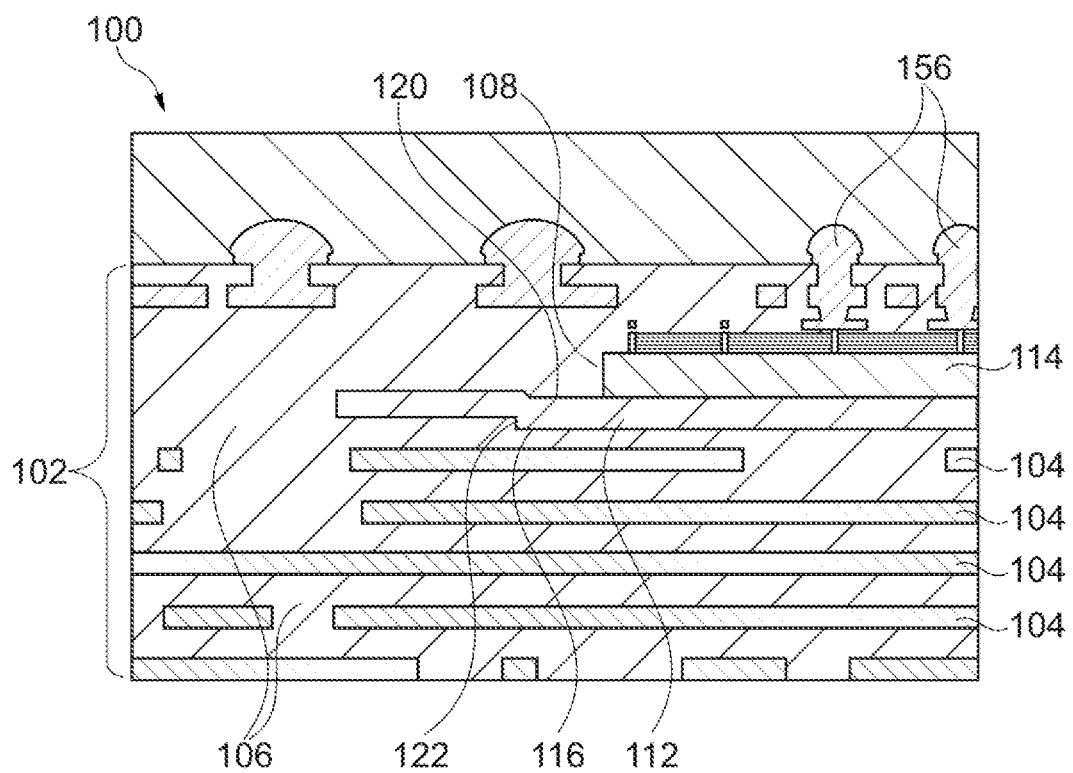
FIG. 20 illustrates a cross-sectional view of a component carrier according to yet another exemplary embodiment of the invention.
Figure 21:
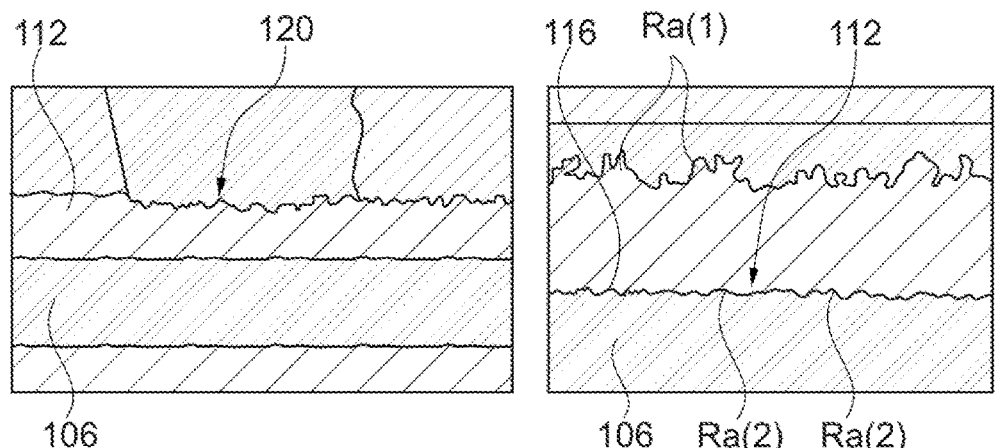
FIG. 21 illustrates cross-sectional views of details of the component carrier according to FIG. 20.

FIG. 20 illustrates a cross-sectional view of a component carrier 100 according to yet another exemplary embodiment of the invention. FIG. 21 illustrates cross-sectional views of details of the component carrier 100 according to FIG. 20. FIG. 20 and FIG. 21 are based on experimental measurements. In particular, FIG. 21 shows a recess 120 on a top side of the stepped metal structure 112. Furthermore, FIG. 21 shows that the roughness Ra is larger on the top side of the stepped metal structure 112 as compared to its bottom side (Ra(1)>Ra(2)).

Figure 22:
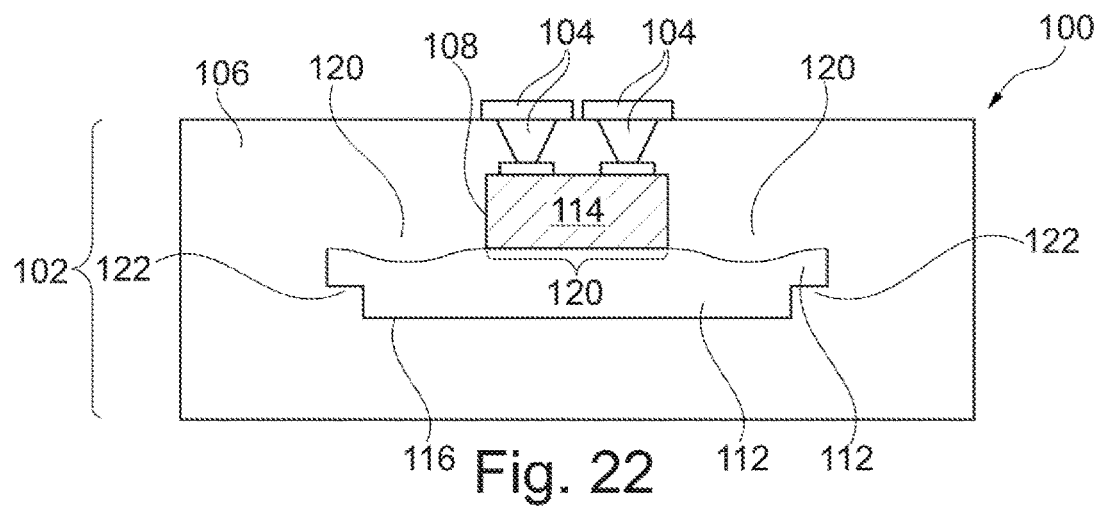
FIG. 22 illustrates a cross-sectional view of a component carrier according to still another exemplary embodiment of the invention.

FIG. 22 illustrates a cross-sectional view of a component carrier 100 according to still another exemplary embodiment of the invention. Descriptively speaking, FIG. 22 is a schematic view of a component carrier 100 similar to the one as shown in the experimental images of FIG. 20 and FIG. 21.

FIG. 22 shows a recess 120 on the top side of the stepped metal structure 112 which may be formed by surface treatment. More specifically, the top side of the stepped metal structure 112 is provided with recess 120 having sections in and around a surface portion on which the component 114 is arranged. As shown, the recess 120 is deeper in the lateral regions around the component 114 compared to the central surface portion of the stepped metal structure 112 on which the component 114 is arranged. The illustrated geometry helps levelling mechanical stress for better resin filling.

Figure 23:
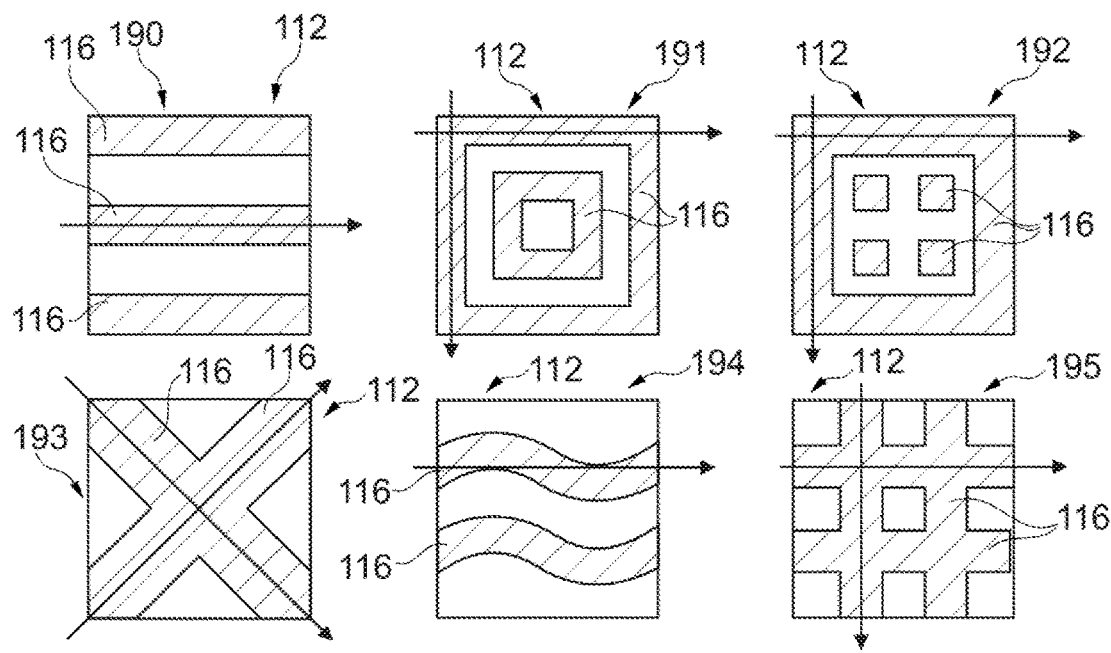
FIG. 23 illustrates various bottom-sided views of stepped metal structures with bottom-sided surface profile defining flat bottom surface portions extending continuously along the entire extension of the stepped metal structure in at least one horizontal direction according to different exemplary embodiments of the invention.

FIG. 23 illustrates various bottom-sided views of stepped metal structures 112 with surface profile and a flat surface in at least one horizontal direction of component carriers 100 according to different exemplary embodiments of the invention. The respective horizontal direction(s) along which a flat bottom surface region extends over the entire lateral extension of the bottom side of the stepped metal structure 112 is/are indicated with arrows in FIG. 23.

Referring to the embodiment according to reference sign 190, a plurality of parallel metallic strips at the bottom of the stepped metal structure 112 form a flat surface 116 along one horizontal direction and extend over an entire spatial range of the bottom of the stepped metal structure 112.

Referring to the embodiment according to reference sign 191, a plurality of annular metallic rings comprising parallel metallic strips at the bottom of the stepped metal structure 112 form a flat surface 116 along two orthogonal horizontal directions and extend over an entire spatial range of the bottom of the stepped metal structure 112.

Referring to the embodiment according to reference sign 192, an annular metallic ring comprising parallel metallic strips at the bottom of the stepped metal structure 112 form a flat surface 116 along two orthogonal horizontal directions and extend over the entire spatial range of the bottom of the stepped metal structure 112. In addition, optional dot-shaped metallic vias are shown.

Referring to the embodiment according to reference sign 193, orthogonal metallic strips at the bottom of the stepped metal structure 112 form a flat surface 116 along two orthogonal horizontal directions and extend over an entire spatial range of the bottom of the stepped metal structure 112.

Referring to the embodiment according to reference sign 194, a plurality of parallel wavy metallic strips at the bottom of the stepped metal structure 112 form a flat surface 116 along one horizontal direction and extend over an entire spatial range of the bottom of the stepped metal structure 112.

Referring to the embodiment according to reference sign 195, orthogonal metallic strips at the bottom of the stepped metal structure 112 form a grid-like flat surface 116 along two orthogonal horizontal directions and extend over an entire spatial range of the bottom of the stepped metal structure 112.

A skilled person will understand that many other geometries of flat surfaces 116 in at least one horizontal direction are possible in addition to those described herein, and in particular those shown in FIG. 3 and FIG. 23.

Figure 24:
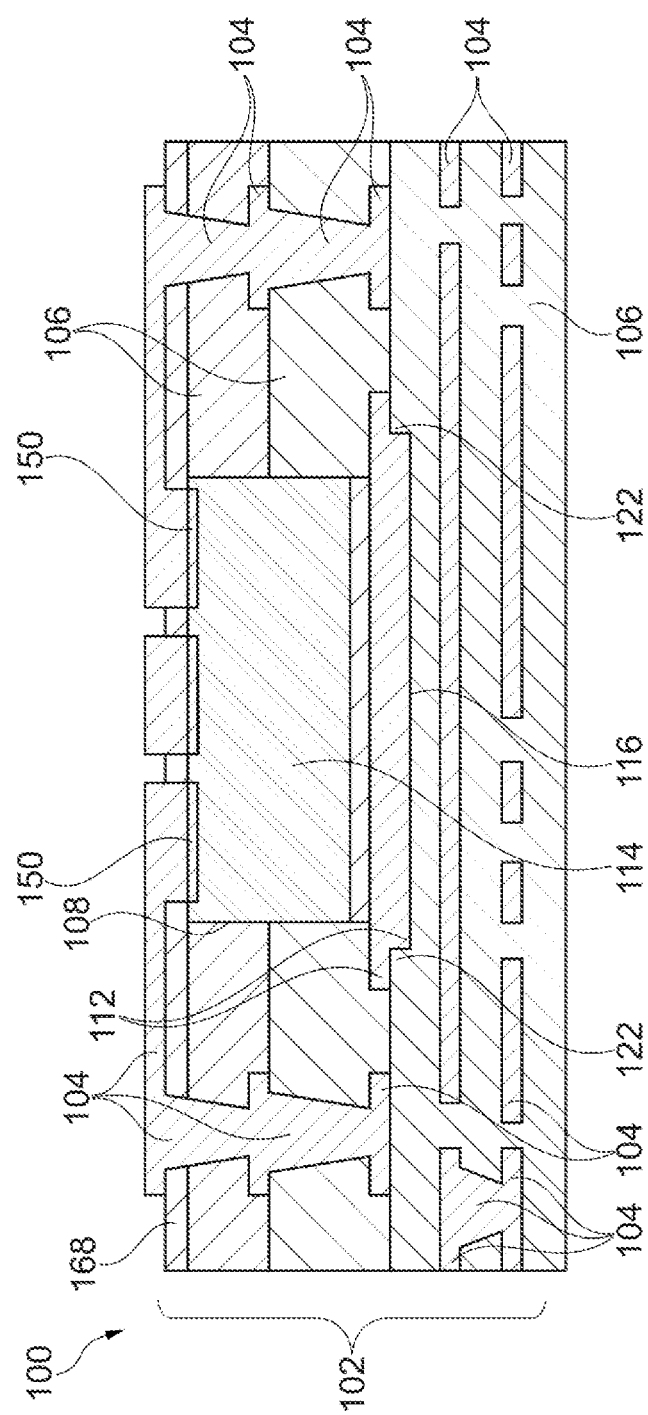
FIG. 24 illustrates a cross-sectional view of a component carrier according to still another exemplary embodiment of the invention.

FIG. 24 illustrates a cross-sectional view of a component carrier 100 according to still another exemplary embodiment of the invention.

A main difference between the embodiment of FIG. 24 and the embodiment of FIG. 19 is that, in the embodiment according to FIG. 24, the electric connection on the top side of the component 114 is realized with a sputtered and subsequently electroplated electrically conductive structure. In other words, one or more pads 150 of the component 114 are electrically contacted by the sputtered and subsequently electroplated electrically conductive structure to thereby connect the component 114 with the electrically conductive layer structures 104. For creating the sputtered and subsequently electroplated electrically conductive structure, the pads 150 may be exposed on the top side by grinding. Thereafter, metallic material may be applied by sputtering, followed by a subsequent electroplating process. Thereafter, a lithography process may be executed to get the patterned sputtered and subsequently electroplated electrically conductive structure shown in FIG. 24. Thus, connection of the pads 150 by a trace instead of a via is possible.

Hence, sputtering may only be used for seed layer formation, because forming a thick metal structure may be more efficient by a subsequent electroplating process. As an alternative to sputtering, such as seed layer may be formed by another electroless process, such as the formation of chemical copper.

According to FIG. 24, the component 114 is connected at such a level that the last dielectric layer structure 106 defining the cavity 108 is flush with the embedded component 114 and the connection is established at this layer (not through another dielectric layer, as it would be the case with laser via connections).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which variants use the solutions shown and the principle according to the invention even in the case of fundamentally different embodiments.

The invention claimed is:
1. A component carrier, comprising:
 a stack comprising at least one electrically conductive layer structure, at least one electrically insulating layer structure and a cavity delimited at a bottom side at least partially by a top side of a stepped metal structure of the at least one electrically conductive layer structure; and a component embedded in the cavity and arranged on the stepped metal structure;

wherein a bottom side of the stepped metal structure has a flat surface extending continuously along at least one horizontal direction;

wherein the stepped metal structure is an integral metal body;

wherein the stepped metal structure comprises an upper layer section and a lower layer section, the upper layer section having a different diameter than the lower layer section such that a step is formed at a vertical sidewall of the metal structure at an interface between the upper layer section and the lower layer section, wherein a ratio between the diameter of the lower layer section and the diameter of the upper layer section is in a range from 70% to 90%.

2. The component carrier according to claim 1, wherein a top side of the stepped metal structure has at least one recess in which the component is arranged.

3. The component carrier according to claim 2, wherein the at least one recess is deeper around the component compared to the surface portion on which the component is arranged.

4. The component carrier according to claim 1, wherein a surface on a top side of the stepped metal structure has a higher roughness Ra than a surface on the bottom side of the stepped metal structure.

5. The component carrier according to claim 1, wherein a surface on a top side of the stepped metal structure has a roughness Ra of at least 0.8 μm.

6. The component carrier according to claim 1, wherein a surface on a top side of the stepped metal structure has a roughness Ra of less than 1.5 μm.

7. The component carrier according to claim 1, wherein a surface on a top side of the stepped metal structure has a first portion and a second portion, the first portion and the second portion having different values of the roughness Ra.

8. The component carrier according to claim 1, wherein a surface on the bottom side of the stepped metal structure has a roughness Ra of not more than 0.7 μm.

9. The component carrier according to claim 1, wherein the stepped metal structure has a larger diameter on a top side compared with a smaller diameter on the bottom side.

10. The component carrier according to claim 1, comprising at least one of the following features:

wherein the stepped metal structure has a step along its entire circumference;

wherein the stepped metal structure has a thickness in a range from 15 μm to 50 μm;

wherein the bottom side of the stepped metal structure is planar;

wherein the bottom side of the stepped metal structure comprises one or a plurality of longitudinal and/or transversal oblong strips spaced by one or a plurality of grooves;

wherein the stepped metal structure is a metallically homogeneous plating structure;

wherein the component is electrically contacted at its top side by an electrically conductive structure formed by an electroless process followed by electroplating.

11. The component carrier according to claim 1, wherein a top side of the stepped metal structure is adjacent to a component and an opposed side of the stepped metal structure abuts at least one electrically insulating layer structure.

12. A method of manufacturing a component carrier, comprising:

providing a stack comprising at least one electrically conductive layer structure and at least one electrically insulating layer structure;

forming a cavity in the stack being delimited at a bottom side at least partially by a top side of a stepped metal structure of the at least one electrically conductive layer structure, wherein a bottom side of the stepped metal structure is formed with a flat surface extending continuously along at least one horizontal direction;

wherein the stepped metal structure is an integral metal body;

wherein the stepped metal structure comprises an upper layer section and a lower layer section, the upper layer section having a different diameter than the lower layer section such that a step is formed at a vertical sidewall of the metal structure at an interface between the upper layer section and the lower layer section, wherein a ratio between the diameter of the lower layer section and the diameter of the upper layer section is in a range from 70% to 90%;

arranging a component on the stepped metal structure; and embedding the component in the cavity.

13. The method according to claim 12, wherein the method further comprises:

forming a recess on a top side of the stepped metal structure.

14. The method according to claim 13, wherein the method further comprises:

forming the recess by surface treatment by at least one of the group consisting of an adhesion promoting process, wet etching, and dry etching.

15. The method according to claim 12, wherein the method further comprises:

forming the stepped metal structure by one-stage electroplating after formation of a seed layer by an electroless process.

16. The method according to claim 12, wherein the method further comprises:

forming a trench in the stack, and subsequently filling the trench and a laterally larger region above the trench with a metal.

17. The method according to claim 16, wherein the method further comprises:

filling the trench by a one-stage electroplating process.

18. The method according to claim 16, wherein the method further comprises:

forming the trench by laser processing.

19. The method according to claim 16, wherein the method further comprises:

forming the trench with a planar bottom surface or with a surface profile at its bottom surface.

* * * * *